US009078345B2

(12) United States Patent
Campagna et al.

(10) Patent No.: US 9,078,345 B2
(45) Date of Patent: Jul. 7, 2015

(54) ENCLOSED TELEVISION WITH IMPROVED CABLE COVER SEALING MECHANISM

(75) Inventors: Michael A. Campagna, Plainfield, IL (US); Jack McKeague, Orland Park, IL (US); Adam Molberger, Schaumburg, IL (US)

(73) Assignee: Ciil Technologies, LLC, Aurora, IL (US)

( * ) Notice: Subject to any disclaimer, the term of this patent is extended or adjusted under 35 U.S.C. 154(b) by 692 days.

(21) Appl. No.: 13/354,968

(22) Filed: Jan. 20, 2012

(65) Prior Publication Data
US 2013/0187521 A1 Jul. 25, 2013

(51) Int. Cl.
*H05K 5/02* (2006.01)

(52) U.S. Cl.
CPC ............. *H05K 5/02* (2013.01); *Y10T 29/49826* (2015.01)

(58) Field of Classification Search
CPC ............ H04N 5/64; H04N 5/655; G09F 9/00; H05K 7/20
USPC ........... 348/836; 361/679.01, 679.21, 679.56, 361/724, 807, 818
See application file for complete search history.

(56) References Cited

U.S. PATENT DOCUMENTS

| | | |
|---|---|---|
| 3,004,815 A | 10/1961 | O'Kain et al. |
| 4,771,299 A | 9/1988 | Gell, Jr. |
| 5,045,971 A | 9/1991 | Ono et al. |
| 5,071,203 A | 12/1991 | Boyd |
| 5,160,357 A | 11/1992 | Faber |
| 5,335,076 A | 8/1994 | Reh et al. |
| D356,548 S | 3/1995 | Bottcher et al. |
| 5,410,373 A | 4/1995 | Sagues et al. |
| 5,420,828 A | 5/1995 | Geiger |
| 5,748,269 A | 5/1998 | Harris et al. |
| 5,850,333 A | 12/1998 | Owanesian et al. |
| 5,869,919 A | 2/1999 | Sato et al. |
| 5,970,980 A | 10/1999 | Adair |

(Continued)

FOREIGN PATENT DOCUMENTS

| | | |
|---|---|---|
| EP | 1 933 555 A1 | 6/2008 |
| GB | 2449877 B | 4/2010 |

(Continued)

OTHER PUBLICATIONS

U.S. Appl. No. 29/362,147, filed May 20, 2010, Moscovitch et al.

(Continued)

*Primary Examiner* — Jay Au Patel
*Assistant Examiner* — Neil Mikeska
(74) *Attorney, Agent, or Firm* — Foley & Lardner LLP

(57) ABSTRACT

An enclosure for enclosing a flat panel display. A bezel includes a peripheral surface defining an enclosure area and an inner edge defining a display opening. A substantially transparent front cover operatively connects to the bezel and covers the display opening. An enclosure housing includes a front opening and an access opening substantially opposite the front opening. An access opening cover is configured to cover the access opening. A sealing member receiving region is defined by one of the enclosure housing and the access opening cover, and a sealing member is operatively connected to the sealing member receiving region. When the access opening cover is operatively connected to the enclosure housing, an interface between the enclosure housing and the access opening cover is substantially sealed and is resistant to liquid ingress.

20 Claims, 8 Drawing Sheets

(56) References Cited

U.S. PATENT DOCUMENTS

| | | | |
|---|---|---|---|
| 5,991,153 A | 11/1999 | Heady et al. | |
| 6,061,976 A | 5/2000 | Willbanks, Jr. | |
| 6,068,119 A | 5/2000 | Derr et al. | |
| 6,101,090 A | 8/2000 | Gates | |
| 6,104,451 A | 8/2000 | Matsuoka et al. | |
| 6,119,768 A | 9/2000 | Dreier et al. | |
| 6,132,367 A | 10/2000 | Adair | |
| 6,424,391 B1 | 7/2002 | Tsukamoto et al. | |
| 6,474,410 B1 | 11/2002 | Minich et al. | |
| 6,476,883 B1 | 11/2002 | Salimes et al. | |
| 6,479,142 B1 | 11/2002 | Condon et al. | |
| 6,480,243 B2 | 11/2002 | Yamamoto | |
| 6,575,541 B1 | 6/2003 | Hedrick et al. | |
| 6,646,864 B2 | 11/2003 | Richardson | |
| 6,659,274 B2 | 12/2003 | Enners | |
| D493,800 S | 8/2004 | Pfister et al. | |
| D494,596 S | 8/2004 | Pfister | |
| 6,783,198 B2 | 8/2004 | Rudd et al. | |
| D497,537 S | 10/2004 | O'Keene et al. | |
| 6,802,575 B1 | 10/2004 | Lee | |
| 6,819,866 B2 | 11/2004 | Da Silva | |
| 6,845,775 B1 | 1/2005 | Barthes | |
| 6,871,138 B1 | 3/2005 | Minelli | |
| 6,888,591 B2 | 5/2005 | Kim | |
| 6,905,101 B1 | 6/2005 | Dittmer | |
| 6,966,617 B2 | 11/2005 | Chen et al. | |
| 6,968,067 B2 | 11/2005 | López | |
| 6,977,666 B1 | 12/2005 | Hedrick's | |
| 6,977,808 B2 | 12/2005 | Lam et al. | |
| 7,089,495 B2 | 8/2006 | Barrows | |
| 7,110,247 B2 | 9/2006 | Kim et al. | |
| D529,490 S | 10/2006 | Jackson, Jr. | |
| D530,595 S | 10/2006 | Lam et al. | |
| 7,140,732 B2 | 11/2006 | Shiraishi et al. | |
| 7,152,836 B2 | 12/2006 | Pfister et al. | |
| 7,158,376 B2 | 1/2007 | Richardson et al. | |
| 7,173,678 B2 | 2/2007 | Havelka et al. | |
| 7,178,775 B2 | 2/2007 | Pfister et al. | |
| 7,180,735 B2 | 2/2007 | Thomas et al. | |
| D538,141 S | 3/2007 | Stenhouse et al. | |
| D539,530 S | 4/2007 | Sanderson et al. | |
| 7,206,037 B2 | 4/2007 | Nishio et al. | |
| 7,212,403 B2 | 5/2007 | Rockenfell | |
| 7,214,970 B2 | 5/2007 | Andoh | |
| D546,824 S | 7/2007 | Jackson, Jr. | |
| 7,257,003 B2 | 8/2007 | Ono | |
| 7,289,320 B2 | 10/2007 | Chang et al. | |
| 7,312,984 B2 | 12/2007 | Richardson et al. | |
| D561,775 S | 2/2008 | Wohlford et al. | |
| 7,334,766 B2 | 2/2008 | Ligertwood | |
| 7,337,024 B1 | 2/2008 | Graham | |
| 7,339,783 B2 | 3/2008 | McEwan et al. | |
| 7,345,875 B2 | 3/2008 | Elkins | |
| D566,661 S | 4/2008 | Ludwig et al. | |
| 7,438,269 B2 | 10/2008 | Pfister et al. | |
| 7,463,487 B2 | 12/2008 | Kim | |
| 7,464,512 B1 | 12/2008 | Perina | |
| 7,522,416 B2 | 4/2009 | Kim et al. | |
| 7,529,082 B2 | 5/2009 | Maruta | |
| 7,535,799 B2 | 5/2009 | Polany et al. | |
| 7,679,888 B2 | 3/2010 | Kirschner et al. | |
| 7,742,141 B2 | 6/2010 | Kawano | |
| 7,812,891 B2 | 10/2010 | Maruta | |
| D641,721 S | 7/2011 | Moscovitch et al. | |
| 8,081,267 B2 | 12/2011 | Moscovitch et al. | |
| 8,102,483 B2 | 1/2012 | Perry et al. | |
| 2003/0205951 A1 | 11/2003 | Lambert | |
| 2004/0000390 A1 | 1/2004 | Stadjuhar, Jr. et al. | |
| 2004/0012729 A1 | 1/2004 | Kim | |
| 2004/0165123 A1 | 8/2004 | Iguchi et al. | |
| 2004/0232301 A1 | 11/2004 | Bremmon et al. | |
| 2005/0133678 A1 | 6/2005 | Dittmer | |
| 2005/0263659 A1 | 12/2005 | Pfister et al. | |
| 2006/0065800 A1 | 3/2006 | Bremmon | |
| 2006/0077314 A1 | 4/2006 | Li et al. | |
| 2006/0077636 A1 | 4/2006 | Kim | |
| 2006/0274493 A1 | 12/2006 | Richardson et al. | |
| 2007/0023599 A1 | 2/2007 | Fedewa | |
| 2007/0139873 A1 | 6/2007 | Thomas et al. | |
| 2007/0262215 A1 | 11/2007 | Tan | |
| 2008/0024694 A1 | 1/2008 | Kondo et al. | |
| 2008/0055849 A1 | 3/2008 | Lee | |
| 2008/0062626 A1 | 3/2008 | Ryman et al. | |
| 2008/0093956 A1 | 4/2008 | Maxson | |
| 2008/0094786 A1* | 4/2008 | Liou et al. | 361/679 |
| 2008/0123014 A1 | 5/2008 | Lin | |
| 2008/0143918 A1 | 6/2008 | Kim | |
| 2008/0156949 A1 | 7/2008 | Sculler et al. | |
| 2008/0218952 A1 | 9/2008 | Benn | |
| 2008/0237426 A1 | 10/2008 | Walters | |
| 2008/0309843 A1 | 12/2008 | Matsutani et al. | |
| 2009/0009945 A1 | 1/2009 | Johnson et al. | |
| 2009/0084918 A1 | 4/2009 | Pfister et al. | |
| 2009/0184893 A1 | 7/2009 | Yang | |
| 2009/0225240 A1 | 9/2009 | Suzuki et al. | |
| 2009/0231807 A1 | 9/2009 | Bouissiere | |
| 2009/0231808 A1 | 9/2009 | Burgner | |
| 2010/0171889 A1 | 7/2010 | Pantel et al. | |
| 2010/0315777 A1 | 12/2010 | Dreher | |
| 2011/0075361 A1 | 3/2011 | Nakamichi et al. | |
| 2011/0085301 A1 | 4/2011 | Dunn | |
| 2011/0216482 A1* | 9/2011 | Moscovitch et al. | 361/679.01 |
| 2012/0229988 A1* | 9/2012 | Mukaide | 361/724 |

FOREIGN PATENT DOCUMENTS

| | | |
|---|---|---|
| JP | 2002158475 A | 5/2002 |
| KR | 2001 048363 A | 6/2001 |
| KR | 100815612 B1 | 3/2008 |
| KR | 1020080042287 A | 5/2008 |
| KR | 1020080054761 A | 6/2008 |
| KR | 100922106 B1 | 9/2009 |
| WO | WO 02/37919 A1 | 5/2002 |
| WO | WO 03/001798 A1 | 1/2003 |
| WO | WO 2009/135308 A1 | 11/2009 |
| WO | WO 2011/011704 A2 | 1/2011 |
| WO | WO 2011/059793 A2 | 5/2011 |

OTHER PUBLICATIONS

U.S. Appl. No. 13/354,981, filed Jan. 20, 2012, Campagna et al.
U.S. Appl. No. 29/405,002, filed Oct. 27, 2011, Seo Byung Hee.
U.S. Appl. No. 12/559, 095, filed Sep. 14, 2009, Hatch et al.
Alibaba.com products, http://alibaba.com/showroom/led_display_led_screen_stadium_let_display.html, May 17, 2010, 9 pages.
"LCD Enclosures™, Protect and Showcase Your Investments!," LCD Enclosures, http://LCDenclosures.com/products_display_enclosures.html, May 17, 2010, 3 pages.
"Waterproof TV-Legends Series Colorful Life," Luxurite UK LTD., http://www.luxurite.com/products/waterproof-TV/waterproof-TV-legend.html, May 17, 2010, 5 pages.
"Pantel—Ultrabright Outdoor Screen TVs," http://panteltv.com, May 17, 2010, 5 pages.
International Search Report and Written Opinion for PCT Application No. PCT/US2010/039815, Title: Display Enclosure, Apr. 14, 2011, 8 pages.
Sanus Systems, The Union of Form and Function, Assembly Instructions for VMPL2 Flat Panel Wall Mount, Sanus Systems, Sep. 29, 2005.
Defendants' Amended Answer for Affirmative Defenses to Plaintiffs Third Amended Complaint, dated Sep. 20, 2011, *Peerless Industries Inc.* v. *Crimson AV, LLC*, Vladimir Gleyzer, United States District Court for the Northern District of Illinois Eastern Division, Case No. 1:11-cv-1768.
Plaintiff Peerless Industries, Inc.'s Initial Infringement Contentions, dated Aug. 2, 2011, Peerless *Industries Inc.* v. *Crimson AV, LLC*, Vladimir Gleyzer, United States District Court for the Northern District of Illinois Eastern Division, Case No. 1:11-cv-1768.
First Supplement to Defendant Crimson AV, LLC's Initial Invalidity and Non-Infringement Contentions, dated Sep. 12, 2011, *Peerless*

(56) References Cited

OTHER PUBLICATIONS

*Industries Inc.* v. *Crimson, AV LLC*, Vladimir Gleyzer, United States District Court for the Northern District of Illinois Eastern Division, Case No. 1:11-cv-1768.
Plaintiff Peerless Industries, Inc.'s Initial Response to Crimson's First Supplemental to Its Initial Invalidity Contentions, dated Sep. 26, 2011, *Peerless Industries Inc.* v. *Crimson, AV LLC*, Vladimir Gleyzer, United States District Court for the Northern District of Illinois Eastern Division, Case No. 1:11-cv-1768.
Defendant Crimson AV, LLC's Initial Invalidity and Non-Infringement Contentions, dated Aug. 29, 2011, *Peerless Industries Inc.* v. *Crimson, AV LLC*, Vladimir Gleyzer, United States District Court for the Northern District of Illinois Eastern Division, Case No. 1:11-cv-1768.
"UL XT 66 Two Component Modified Polyurea Protective Coating," Ultimate Linings, www.ultimatelinings.com, Oct. 26, 2009, 3 pages.
"Reactor™ 230Vac Three Phase, Electric, Heated, Plural Component Proportioner Electrical Diagrams," Graco. Inc., 2003, 10 pages.
"Peerless® Mounts Audio/Visual Mounting Solutions, Product Catalog," Peerless Industries, Inc., pp. 89-91, Jul. 1, 2008.
"Installation Instructions DGC Series Display Guard™ Enclosures DGC32, DGC42, DGC-50 and DGC-65," Chief Manufacturing Inc., Apr. 2007.
"Pro AV Home Entertainment, Display Guards™ Indoor/Outdoor," Chief Manufacturing, CSAV, Inc, 2007.
"Flat Panel Frames/Enclosures," Chief Manufacturing, http://www.chiefmfg.com/, 2008.
"DGC/DGCA Series DGC/DGCA Series Indoor/Outdoor Enclosures," Chief Manufacturing, http://www.chiefmfg.com/, 2008.
"Viewstation by Itsenclosures, Protecting the Products That Serve People," ITS Enclosures, http://itsenclosures.com/viewstation, 2006.
"Itsenclosures Model #—LFD573710-xx 50" viewstation LFD Data," Its Enclosures, Standard Product Data Sheet, Mar. 15, 2005.
"Viewstation by Itsenclosures, Outdoor VS-O-LFD573710, 50" Outdoor," ITS Enclosures, http://itsenclosures.com/products, 2006.
"Viewstation by Itsenclosures, Outdoor Protect Your Message," ITS Enclosures, http://itsenclosures.com/products, 2006.
"Infinitus, Digital Video Advertising iMotion Outdoor 65 Inch," Infinitus d.o.o., http://www.infinitus-outdoor.com, 2008.
"Infinitus, Digital Video Advertising Product Gallery," Infinitus d.o.o., http://www.infinitus-outdoor.com, 2008.
"Infinitus, Digital Video Advertising iMotion Outdoor 52 Inch," Infinitus d.o.o., http://www.infinitus-outdoor.com, 2008.
"Imotion® Products and Services of Infinitus, Slovenia," lnfinitus Digital Video Oglasevanje d.o.o., Ljubljana, Feb. 2008.
"Waterproof TV Sales, Outdoor Advertising Display with "Optional Anti-Theft Bracket,"" Visionary AV Solutions Ltd., http://plasmasdirects.co.uk/, Apr. 24, 2008.
"Sunlight Readable LCD Monitors," SunlightLCD.com, http://www.sunlightlcd.com/outdoor-sunlight-readable-weatherproof-lcd-tv.html, Apr. 24, 2008.
"Christie Accessories & Options," Christie Digital Systems, Inc., http://www.christiedigital.com, Apr. 24, 2008.
"SunBriteTV All Weather Outdoor LCD Television Model 2310D," SunBright TV LLC, 2006.
"Suncutter LCD Display, The Professional's Choice in Outdoor LCD Technology," Suncutter LCD Display, http://www.suncutter.com, Apr. 24, 2008.
"Outdoor Television . . . Really! Suncutter LCD Display Screens," Suncutter LCD Display, http://www.suncutter.com, No date available.
"You have to see it to believe it, Suncutter LCD Screens," http://www.suncutter.com, No date available.
"Slash Gear Television W104 Water Proof LCD TV for Your Bath or Pool," SlashGear, http://www.slashgear.com, Apr. 24, 2008.
"All-Weather Outdoor Ultra-Bright Flat-Screen HDTV n ns and Accessories," Pantel, http://www.Panteltv.com, No date available.
"Sanyo Weatherproof 42" LCD Monitor," Sanyo North America Corp., 2008.
"Customer Print DGCA-32," chief manufacturing, Inc. http://www.chiefmfg.com/productdetail.aspx?AccessoryID=734, Aug. 20, 2007.

* cited by examiner

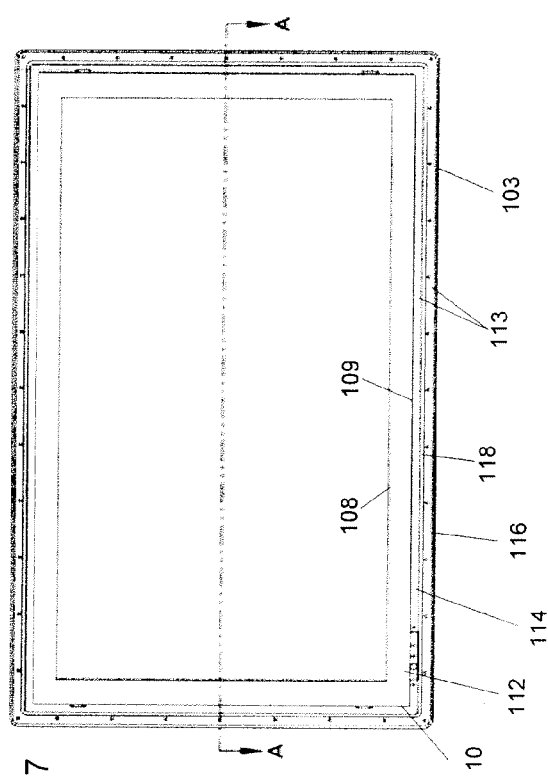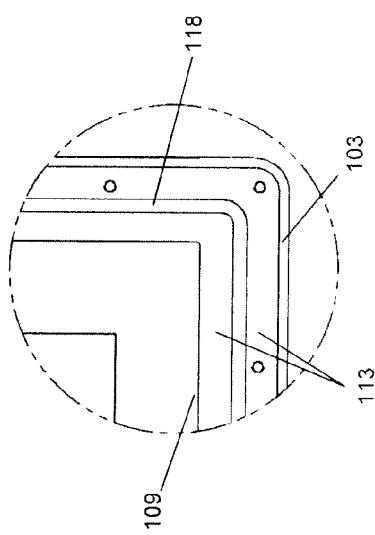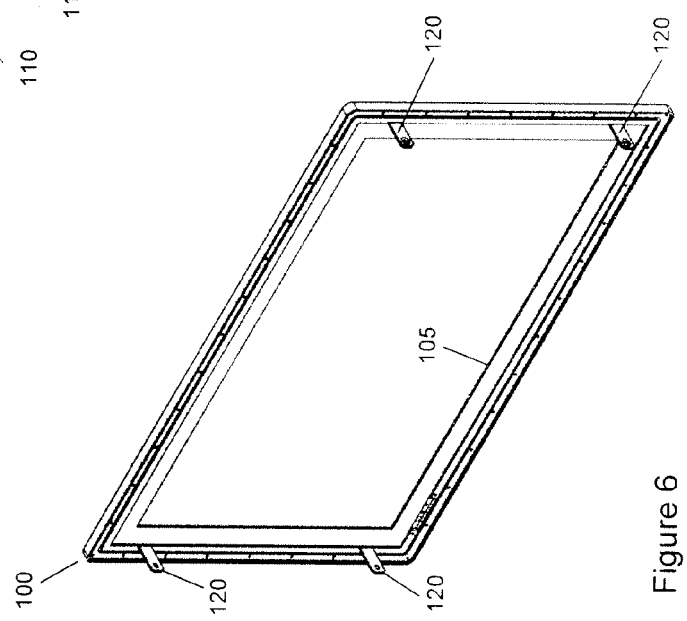

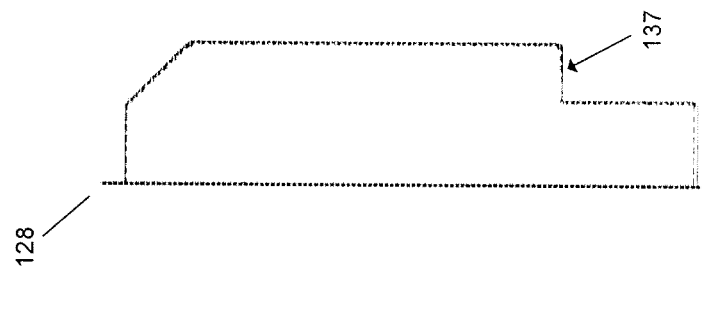
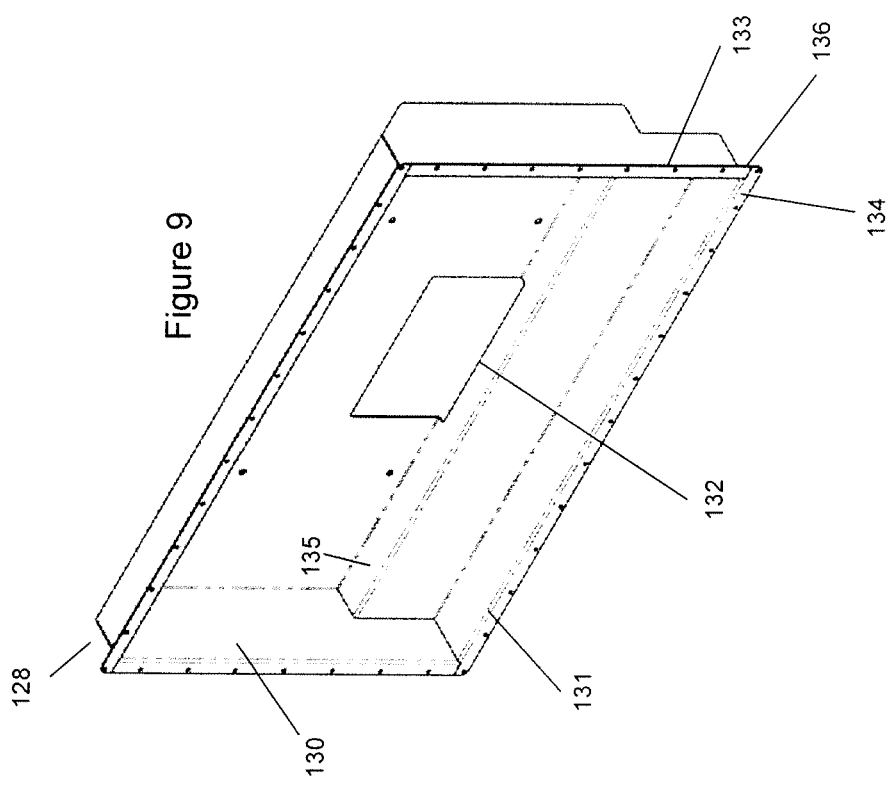

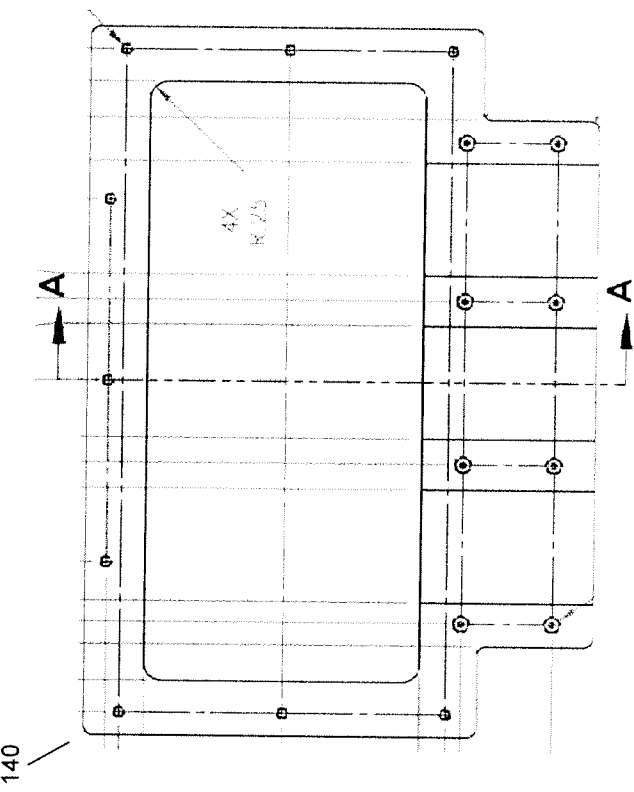
Figure 13
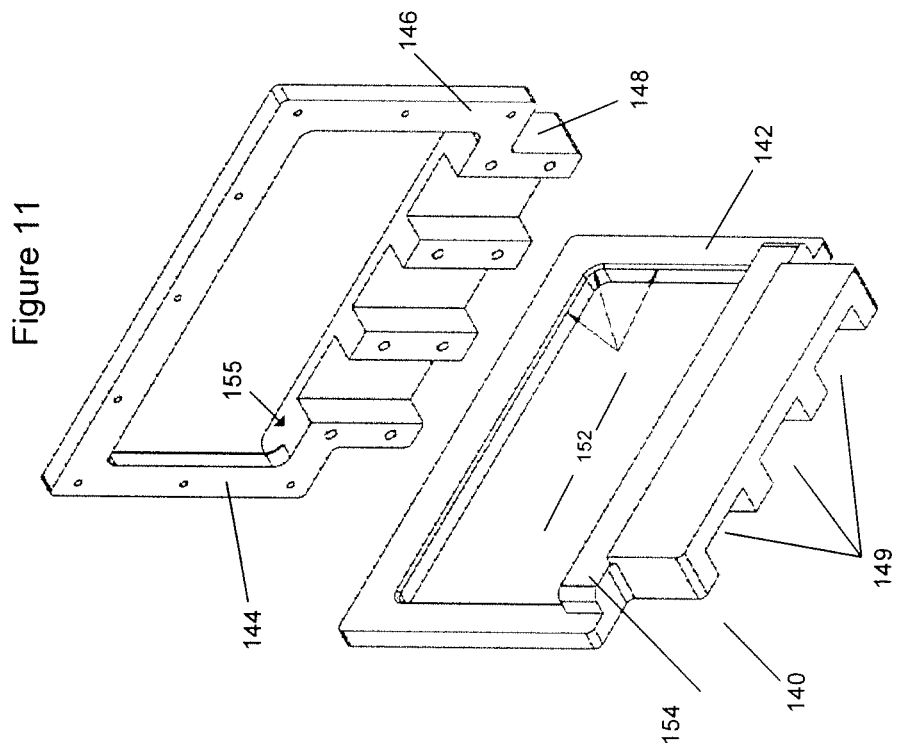
Figure 11
Figure 12

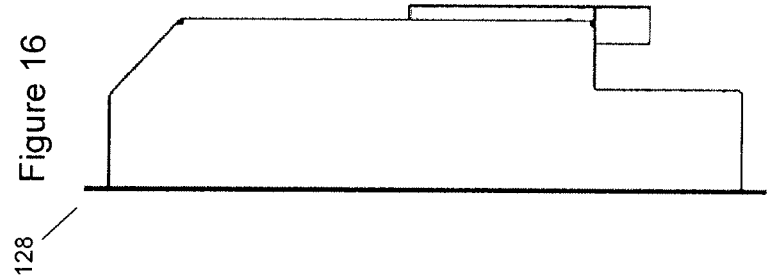
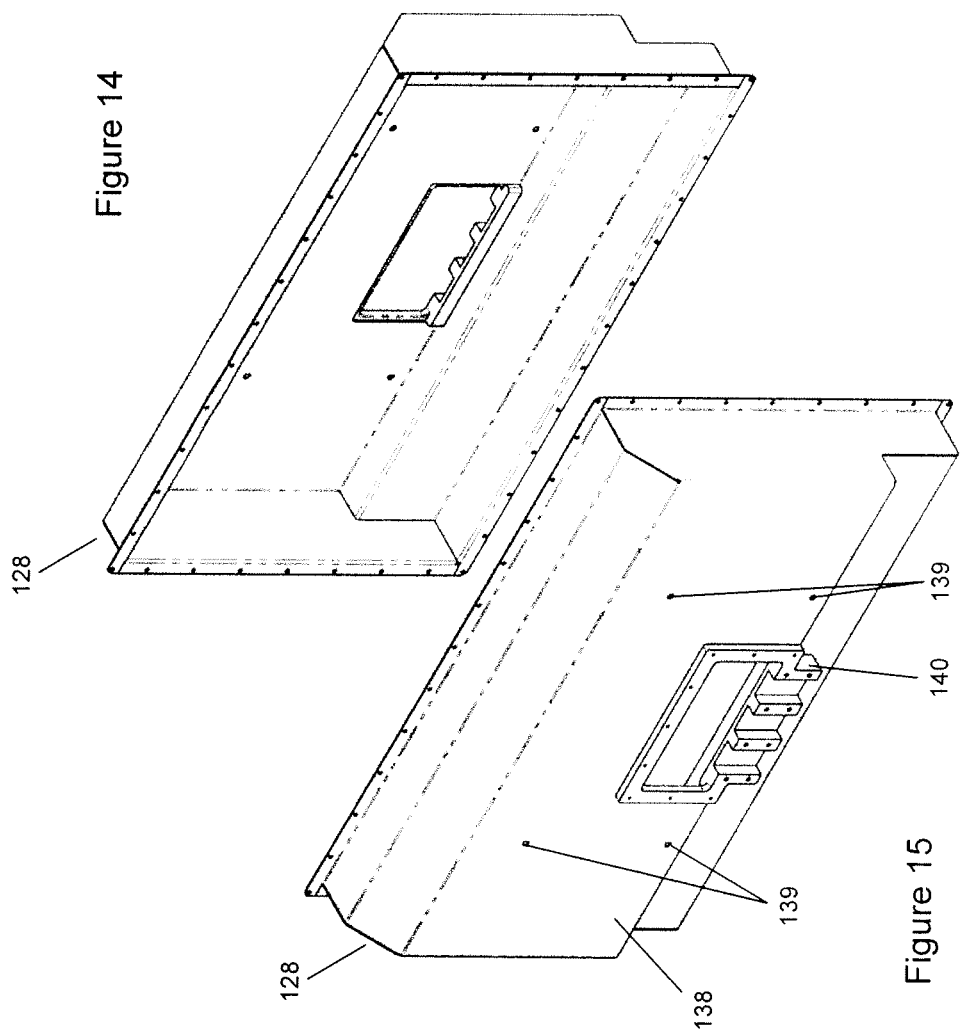

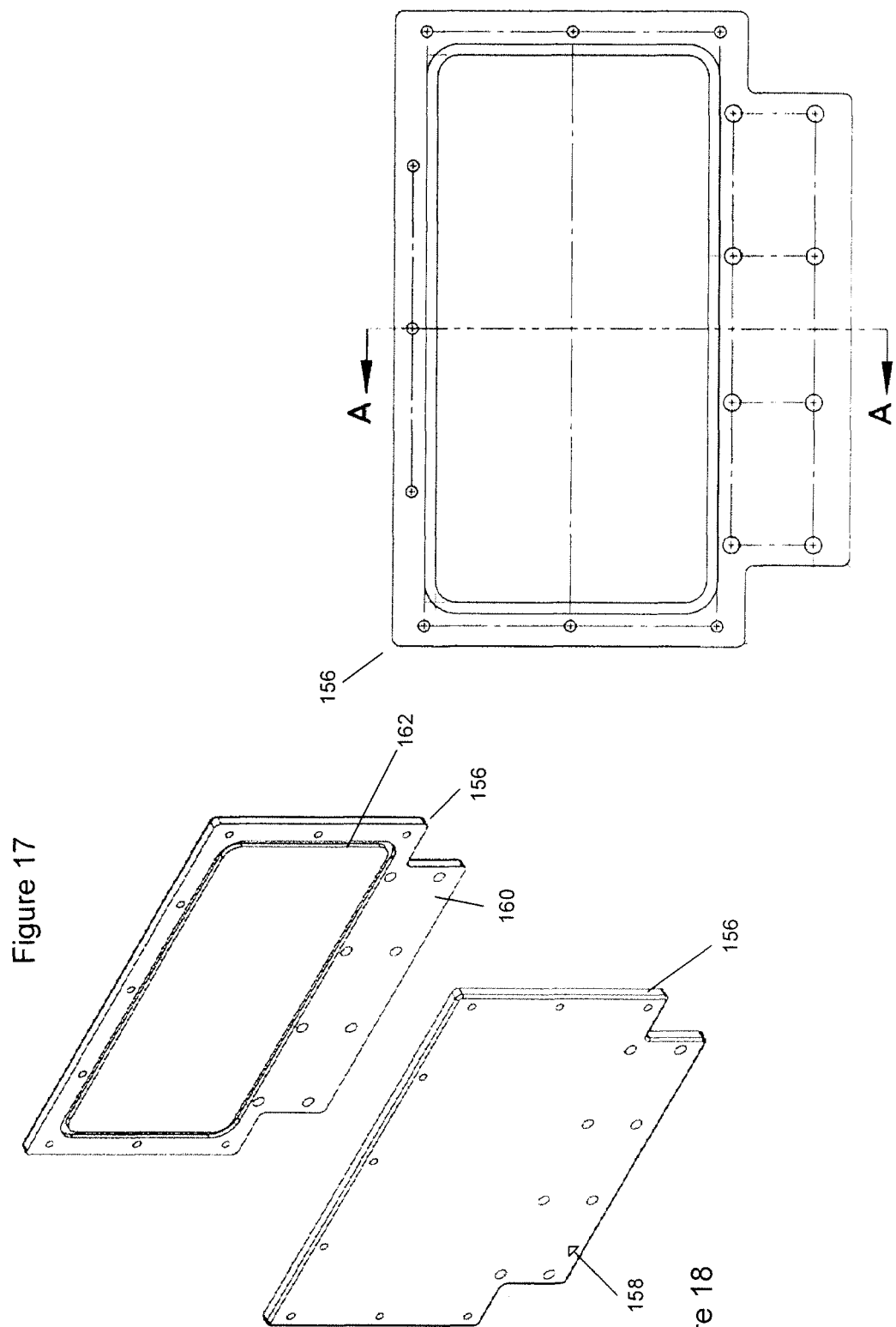

ENCLOSED TELEVISION WITH IMPROVED CABLE COVER SEALING MECHANISM

FIELD OF THE INVENTION

The present invention relates generally to structures for enclosing display devices. More particularly, the present invention relates to enclosures for protecting flat-panel display devices from ambient conditions encountered in a viewing location.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

In recent years, flat panel televisions have become enormously popular in both commercial and residential sectors. As the prices for plasma, liquid crystal display (LCD) and light-emitting diode (LED) flat panel displays have continued to fall, and the quality for the same devices have improved, more and more businesses and individuals have purchased such devices for both home and business purposes.

The advantages of flat panel displays has also led to expanded application and placement of display devices, including locating display devices in new and challenging and environments. For example, display devices might be located outdoors in various residential and commercial settings for entertainment or marketing purposes, potentially exposing the display device to damaging rain, snow, debris, and other elements. Display devices might also be located in indoor environments such as restrooms, kitchens, and industrial settings for various entertainment, marketing, and informational purposes. As with outdoor applications, liquids and other potential contaminants may be near or come into contact with the mounted display device, potentially damaging or degrading the performance of the display device. It is desirable to protect the display device, which is often quite expensive, from exposure to environmental and other potential contaminants. Accordingly, various, sometimes bulky, environmental enclosures have been developed that are intended to protect a display device from the elements and other containments to permit locating such displays outdoors and in other potentially inhospitable environments.

SUMMARY

In one embodiment, an enclosure for enclosing a flat panel display for viewing that is substantially sealed and resistant to liquid ingress is substantially sealed and resistant to liquid ingress is disclosed. The enclosure comprises a bezel, a substantially transparent front cover, an enclosure housing, and a bezel seal. The bezel includes a peripheral surface and defines an enclosure area and a display opening. The substantially transparent front cover is operatively connected to the bezel and covers the display opening. The enclosure housing defines a front opening and has an enclosure housing interface disposed about a periphery of the front opening. The bezel seal is disposed between the bezel and the enclosure housing. The bezel is operatively connected to the enclosure housing interface, and the bezel, the substantially transparent front cover, and the enclosure housing define the enclosure configured to receive a flat panel display therein.

In another embodiment, an enclosure for enclosing a flat panel display for viewing that is substantially sealed and resistant to liquid ingress is disclosed. The enclosure comprises a bezel, a substantially transparent front cover, and an enclosure housing. The bezel has a peripheral surface defining an enclosure area, an inner edge defining a display opening, and a rear surface. The substantially transparent front cover is operatively connected to the bezel and covers the display opening. The enclosure housing has a front opening and a flange disposed about and extending from the front opening. The bezel and the enclosure housing are joined together at a joining region that is substantially impervious to liquid ingress. The bezel, the front cover, and the enclosure housing define the enclosure configured to receive a flat panel display therein.

In yet another embodiment, a method of preparing a substantially sealed enclosure for enclosing a flat panel display device for viewing is disclosed. The method comprises providing a bezel defining an outer peripheral surface and a display opening and providing a front cover to the bezel such that the front cover covers the display opening. The method further comprises providing a bezel seal and attaching an enclosure housing to the bezel such that the bezel seal is disposed between the bezel and the enclosure housing and such that the interface between the bezel and the enclosure housing is substantially sealed and resistant to liquid ingress.

These and other features, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 6 is a rear perspective view of the bezel of the enclosed display device of FIG. 1;

FIG. 7 is a rear plan view of the bezel of FIG. 6, and FIG. 7A is a call-out of a corner of the bezel of FIG. 7;

FIG. 8 is a left side elevational view of the bezel of FIG. 6;

FIG. 9 is a front perspective view of the enclosure housing of the enclosed display device of FIG. 1;

FIG. 10 is a right side elevational view of the enclosure housing of FIG. 9;

FIG. 11 is a rear perspective view of the mounting frame of the enclosure housing of the enclosed display device of FIG. 1;

FIG. 12 is a front perspective view of the mounting frame of FIG. 11;

FIG. 13 is a rear plan view of the mounting frame of FIG. 11;

FIG. 14 is a front perspective view of the enclosure housing of the enclosed display device of FIG. 1, with the mounting frame of FIGS. 11-12 attached;

FIG. 15 is a rear perspective view of the enclosure housing of FIG. 14, with the mounting frame of FIGS. 11-12 attached;

FIG. 16 is a right side elevational view of the enclosure housing of FIG. 14, with the mounting frame of FIGS. 11-12 attached;

FIG. 17 is a rear perspective view of the access opening cover of the enclosed display device of FIG. 1;

FIG. 18 is a front perspective view of the access opening cover of FIG. 17;

FIG. 19 is a rear plan view of the access opening cover of FIG. 17; and

DETAILED DESCRIPTION OF VARIOUS EMBODIMENTS

Figure 1:
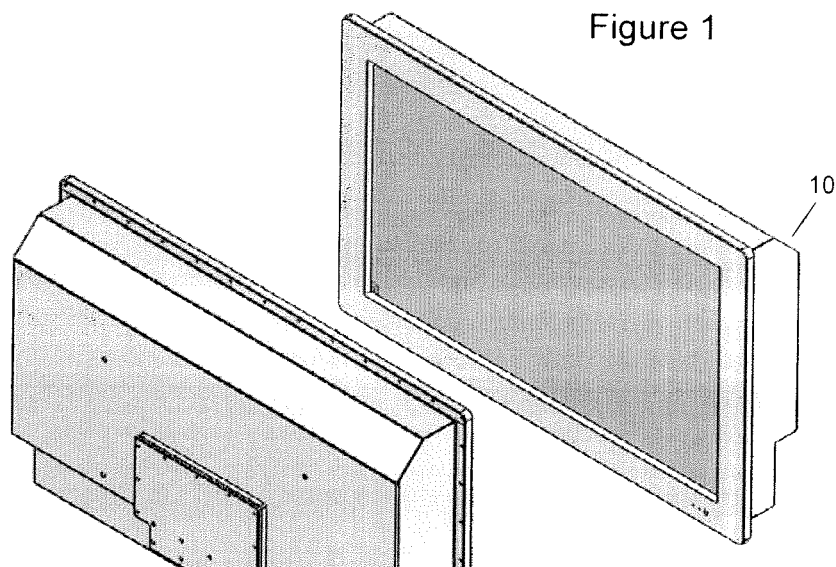
FIG. 1 is a front perspective view of an enclosed display device constructed in accordance with an embodiment of the present invention.
Figure 2:
FIG. 2 is a rear perspective view of the enclosed display device of FIG. 1.
Figure 3:
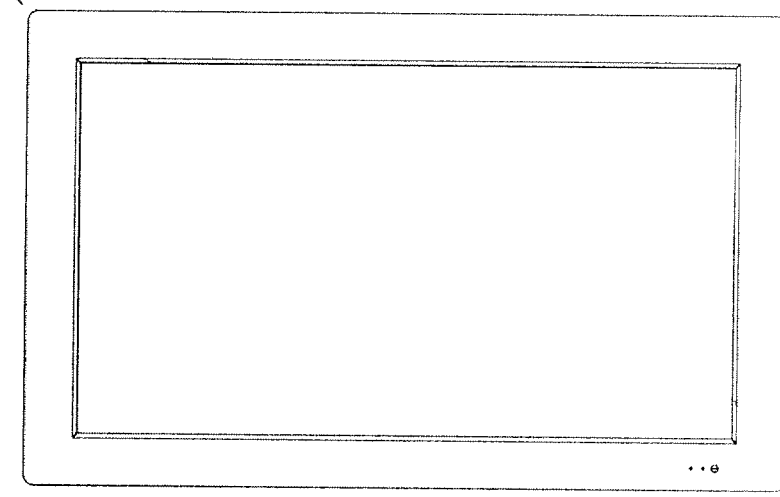
FIG. 3 is a front plan view of the enclosed display device of FIG. 1.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Overview of Display Enclosure

FIGS. 1-5 illustrate a display enclosure 10 constructed in accordance with an embodiment of the present invention. The display enclosure 10 is a protective enclosure configured to enclose a display device 124 such as a plasma, LCD, or LED flat panel display device 124. The display enclosure 10 comprises an enclosure housing 128 having an access opening 132 and a front opening 130 substantially opposite the access opening 132, the enclosure housing 128 configured to receive a display device 124. A bezel 100 is configured to couple to the enclosure housing and defines a display opening 105. A front cover 122 is coupled to the bezel and covers the display opening 105 of the bezel 100. The front cover 122 comprises a substantially transparent material that permits viewing of the display device 124 within the display enclosure 10. A bezel seal 126 is disposed between the bezel 100 and the enclosure housing 128. The display enclosure 10 further comprises a mounting frame 140 disposed about a periphery of the access opening 132 and coupled to the rear surface 138 of the enclosure housing 128. An access opening cover 156 is coupled to the mounting frame 140 and defines a cable entry portion 148 that permits passage of various power, video, audio, and other data carrying cables to the access opening 132. An access opening seal 164 is disposed between the mounting frame 140 and the access opening cover 156.

The display enclosure 10 is constructed so that the display device 124 may be located in an outdoor viewing environment or in other environments where the display device 124 requires, or may benefit from, protection from ambient conditions. Accordingly, the display enclosure 10 is constructed to resist and substantially prevent ingress of various liquids that may be encountered in the viewing location, including precipitation when the display enclosure 10 is mounted for outdoor viewing of the display device 124. In various embodiments, the display enclosure 10 is constructed to prevent ingress of rain, snow, splashing liquid, and various atmospheric particulates. In one embodiment, the display enclosure 10 is constructed to be substantially sealed and resistant to liquid ingress. In a more particular embodiment, the display enclosure 10 is constructed to be impervious to liquid ingress. More particularly, the display enclosure 10 is constructed to be impervious to the ingress of liquid at a submersed depth of up to 1 meter of water, which may correspond to a modified rating of the IP67 standard (the contents of which are incorporated herein by reference).

As described in detail below, the display enclosure 10 may be provided with features that enable or enhance performance and operation under various ambient conditions, while protecting the display device 124 from adverse conditions such as liquids and/or various particulates present in the atmosphere that may come into contact with the display enclosure 10. The bezel 100, for example, may be constructed to provide the display enclosure 10 with a narrow periphery, or a low profile, that closely surrounds the display opening 105 through which the display area of the display device 124 is visible. Thus, the outer periphery 106 of the bezel 100 defines an enclosure area and the display opening 105 defines a display opening area. In this configuration, the distance between a bezel inner edge 108 and an outer periphery 106 of the bezel 100, the bezel thickness, is minimized. In a particular embodiment, the bezel thickness is less than about 50 mm, and in a further embodiment, the bezel thickness is less than about 25 mm. In further embodiments, the bezel thickness may fall between about 25 mm and about 50 mm.

The low profile of the bezel 100 permits the display area of the display device 124 to closely approach the periphery of the bezel 100. For example, the display opening area is maximized relative to the enclosure area. In a particular embodiment, the display opening area is at least about 85 percent of the enclosure area, and in another embodiment, the display area opening is at least about 92 percent of the enclosure area. In further embodiments, the display opening area may fall between about 85 percent and about 92 percent of the enclosure area. The above described configurations offer a clean, low profile look where the edge of the display area of the display device 124 is in proximity to the periphery of the display enclosure 10. These configurations permit, for example, a plurality of enclosures 10, each with a display device 124, to be arranged in a video wall such that the respective display devices 124 are in close proximity to one another, thereby enhancing the presentation of the image or images displayed on the display devices 124.

The display enclosure 10 may also include thermal modulation features. Such thermal modulation features may be active and/or passive and provide temperature control within the display enclosure 10 to assist in maintaining an internal temperature within the display enclosure 10 that is within an operating range of the display device 124. Still further, the display enclosure 10 may include various additional features that, for example, sense ambient light conditions and communicate with the display device 124 to adjust the brightness of the display to enhance viewability of the display device 124 under various light conditions.

Enclosure Housing

Figure 5:
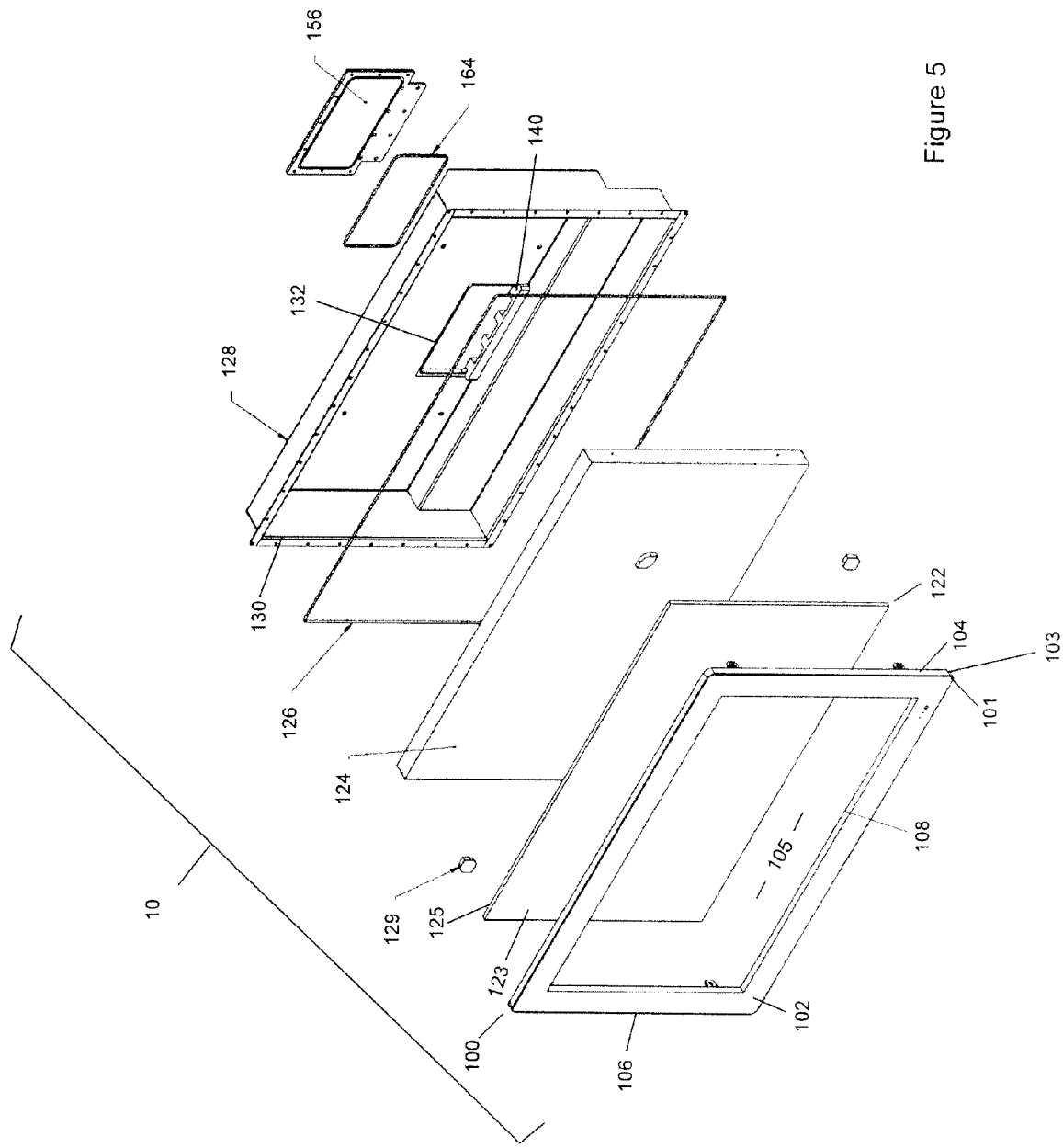
FIG. 5 is an exploded view of the enclosed display device of FIG. 1.
Figure 20:
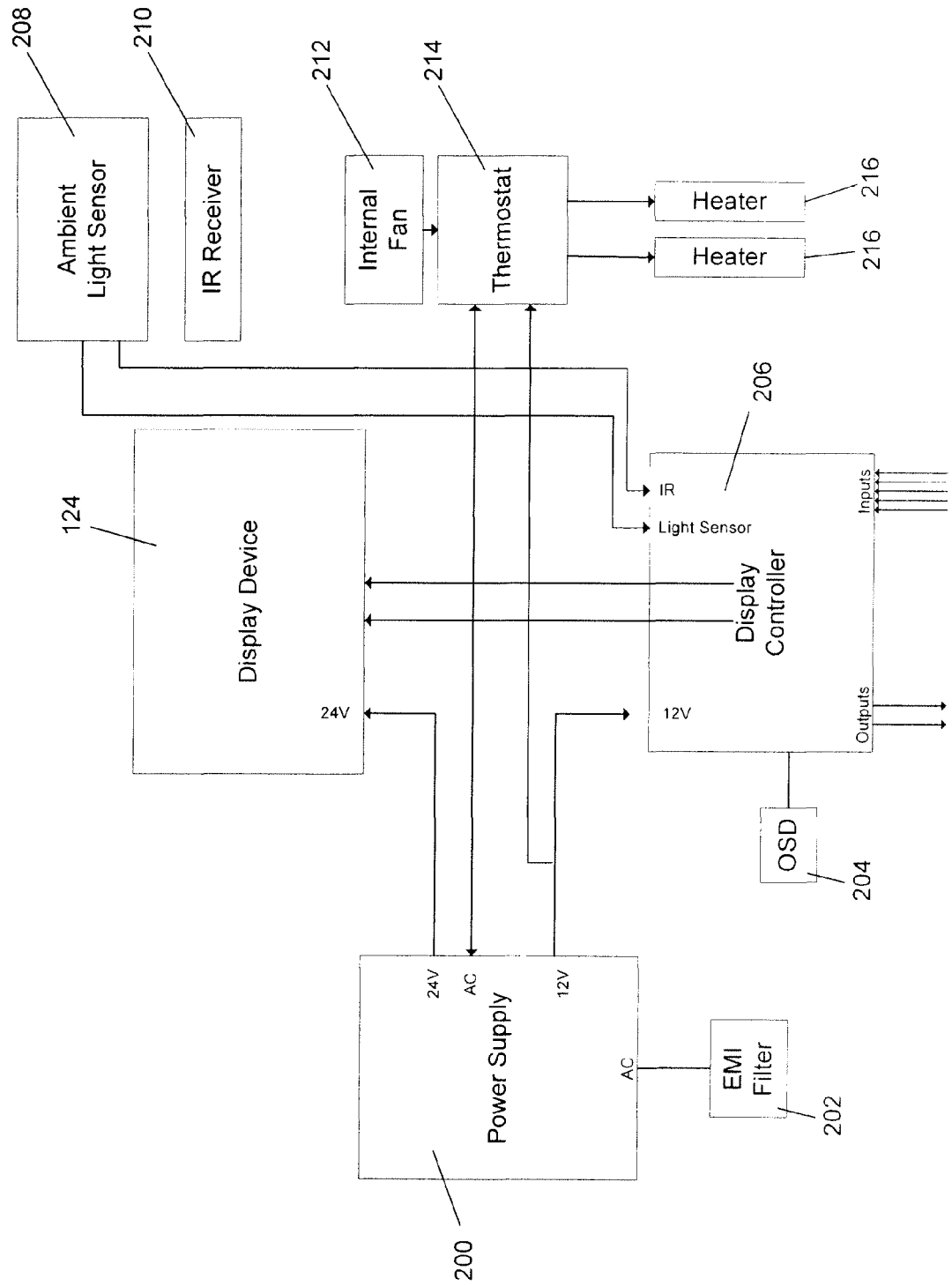
FIG. 20 is a schematic illustrating components of the enclosed display device of FIG. 1.

FIGS. 5, 9-10, and 14-16 illustrate an embodiment of the enclosure housing 128. The enclosure housing 128 includes an access opening 132 in the rear surface 138 of the enclosure housing 128 and a front opening 130 substantially opposite the access opening 132. The enclosure housing 128 is generally sized such that the display device 124 fits within the region defined by the front opening 130. The access opening 132 provides entry for power and signal cables coupled to a display device 124 disposed within the display enclosure 10. As depicted in FIGS. 5 and 14-15, and described in further detail below, the access opening 132 is configured to receive a portion of the mounting frame 140.

The enclosure housing 128 includes an enclosure housing flange 133 disposed about a periphery of the front opening 130. The enclosure housing flange 133 extends outwardly between a front opening edge 131 and a flange edge 136 and defines an enclosure housing bezel interface 134. The enclosure housing bezel interface 134 is configured to couple to the bezel 100. In a particular embodiment, the enclosure housing bezel interface 134 is configured to couple to the bezel interface 113. As explained in further detail below, in an alternative embodiment, the enclosure housing bezel interface 134 may further comprise an enclosure housing groove configured to receive at least a portion of a bezel seal 126.

The depicted enclosure housing 128 is constructed of aluminum to provide a balance of high strength and low weight, yet be resistant to rust or other corrosion typical of expected mounting environments. However, other materials and metals may be used, especially when used in conjunction with a corrosion resistant coating.

As illustrated in FIG. 15, the enclosure housing 128 may include a plurality of mount attachment features 139 that permit the display enclosure 10 to be coupled to a pedestal, wall mount, ceiling mount, or other mounting system. In an embodiment, the plurality of mount attachment features 139 comprises openings disposed in the rear cover assembly according to an industry standard pattern.

The enclosure housing 128 is joined to the bezel 100 in a manner that prevents ingress of liquids into the display enclosure 10. A plurality of connecting elements may be received about the perimeter of the enclosure housing 128 to join the enclosure housing 128 to the bezel 100. It will be appreciated that the connection of enclosure housing 128 to the bezel 100 is configured to prevent ingress of liquid into the display enclosure 10. Thus, as illustrated in FIG. 5 and described in further detail below, a bezel seal 126 is disposed between the enclosure housing 128 and the bezel 100 to provide appropriate sealing of the display enclosure 10.

Bezel

As illustrated in FIGS. 1-7, the bezel 100 comprises a single-piece design, defining an outer periphery 106 of the display enclosure 10. The frame members may be joined by welding, adhesives, connecting elements, and combinations thereof. Whether a single piece design or an assembly of frame members, the bezel 100 may be constructed of metal such as aluminum or other material capable of providing sufficient strength and rigidity, while maintaining a low peripheral profile for the display enclosure 10. Similarly, regardless of the specific construction of the bezel 100, it will be appreciated that, in use, the bezel 100 seals the front opening 130 of the enclosure housing 128 and prevents ingress of liquids and other containments into the display enclosure 10 that may be encountered in the mounting environment.

The bezel 100 is constructed such that the width of the bezel, i.e., the perpendicular distance between the bezel inner edge 108 and the bezel outer surface 104, the portion visible when viewing the display enclosure 10 from the front, is minimized. That is, the bezel 100 has a low profile surrounding the display opening 105. For example, in a particular embodiment, the distance between the bezel inner edge 108 and bezel outer surface 104 of the display enclosure 10 is less than about 25 mm. Put differently, the area of the display opening 105 (e.g. the viewing area) is maximized relative to the area of the display enclosure 10 defined by the bezel outer surface 104 of the display enclosure 10. For example, in a particular embodiment, the area of the display opening 105 is at least about 85 percent of the area of the display enclosure 10. In another particular embodiment, the area of the display opening 105 is at least about 92 percent of the area of the display enclosure 10. The low peripheral profile of the bezel 100 may enhance the overall look of the display enclosure 10, as well as minimize the space needed in a mounting location for installation of an enclosed display device 124. In multiple screen arrangements, where several displays are positioned horizontally and/or vertically adjacent one another, the low profile of the bezel 100 may provide an enhanced seamless appearance of the displayed image(s) on the multiple display devices 124.

As illustrated in FIGS. 5-7, the bezel 100 forms the bezel outer periphery 106, defining a bezel outer surface 104. The bezel outer surface 104 extends from a peripheral front edge 101 to a peripheral rear edge 103. The bezel inner edge 108 defines a display opening 105. The display area of the display device 124 is visible through the display opening 105. As such, the bezel 100 may be constructed to various dimensions to accommodate display devices 124 of different sizes. For example, the bezel 100 may be constructed in accordance with display device 124 screen sizes that are commonly manufactured. In a particular embodiment, the bezel 100 is constructed to accommodate a 32 inch display device 124. In another particular embodiment, the bezel 100 is constructed to accommodate a 55 inch display device 124.

The bezel 100 includes a bezel front surface 102 and a bezel rear surface 110 substantially opposite the bezel front surface 102. The bezel rear surface 110 is defined by an area extending between the bezel inner edge 108 and the bezel outer periphery 106. The bezel rear surface 110 comprises a front cover interface 112 and a bezel interface 113. A bezel seal groove 118 is disposed on the bezel interface 113, defining an inner bezel interface 114 and an outer bezel interface 116. In an alternative embodiment, the bezel 100 may not include a bezel seal groove 118. In such embodiments, an enclosure housing groove may be disposed on an enclosure housing bezel interface 134 and configured to receive a bezel seal 126. In yet another alternative embodiment, the bezel 100 may include a bezel seal groove 118 and the enclosure housing bezel interface 134 may include an enclosure housing groove.

The front cover interface 112 is recessed from the bezel interface 113, defining a bezel front cover ledge 109. The recessed front cover interface 112 extends from the bezel front cover ledge 109 to the bezel inner edge 108. The front cover interface 112 and the bezel front cover ledge 109 are configured to receive the front cover 122. In other embodiments, the front cover interface 112 and the bezel front cover ledge 109 may be disposed on the bezel front surface 102, permitting the front cover 122 to be mounted substantially flush with the bezel front surface 102. Other embodiments may include no front cover interface 112 and mount, for example, the front cover 122 on the bezel front surface 102.

In the depicted embodiment, the bezel interface 113 is configured to couple to the enclosure housing bezel interface 134. When coupled, the flange edge 136 of the enclosure housing 128 is disposed within, and adjacent to, the bezel outer periphery 106. Because the bezel outer surface 104 extends rearward beyond the bezel rear surface 110, when the bezel 100 is coupled to the enclosure housing 128, the bezel peripheral rear edge 103 extends over and beyond the flange edge 136.

The bezel 100 is joined to the enclosure housing 128 in a manner that prevents ingress of liquids into the display enclosure 10. A plurality of connecting elements may be received about the perimeter of the bezel 100 to join the bezel 100 to the enclosure housing 128. It will be appreciated that the connection of the enclosure housing 128 to the bezel 100 is configured to prevent ingress of liquid into the display enclosure 10. Thus, as illustrated in FIG. 5 and described in further detail below, a bezel seal 126 is disposed between the bezel 100 and the enclosure housing 128 to provide appropriate sealing of the display enclosure 10.

As depicted in FIGS. 6-8, the bezel 100 includes connecting brackets 120. The connecting brackets 120 are coupled to the bezel rear surface 110. The connecting brackets 120 generally comprise elongated members with openings for receiving connecting elements to secure the bezel 100 to the display device 124. As depicted in FIG. 5, the front cover 122 is operatively connected to the bezel rear surface 110, a plurality of deformable or elastomeric spacers 129 are placed on placed on a surface of the front cover 122, and the display device 124 is coupled to the bezel 100 via the connecting brackets 120. One feature of the spacers 129 is that their deformability accounts for thermal gradients in the atmosphere and operating temperatures, minimizing the chances that the expansion and contraction of the display enclosure will cause the front cover 122 or display device 124 to break. In addition, once compressed during assembly of the display enclosure, the spacers 129 provide a restorative force between the bezel 100 and the enclosure housing 128 that ensures that the bezel seal is not over-compressed. The bezel 100, front cover 122, and display device 124 may then be coupled to the enclosure housing 128. While the depicted embodiment includes connecting brackets 120, other alternative embodiments may not include connecting brackets 120. In such alternative embodiments, the display device 124 may be connected to the enclosure housing 128 with support brackets, and the bezel 100 may be independently coupled to the enclosure housing 128.

Bezel Seal

The bezel 100 is joined to the enclosure housing 128 in a manner that prevents ingress of liquids into the display enclosure 10. As illustrated in FIG. 5, the display enclosure 10 includes a bezel seal 126 disposed between the bezel 100 and the enclosure housing. In an embodiment, the bezel seal 126 may comprise an o-ring. In the embodiment depicted in FIGS. 5-7A, 9, and 14-15, the bezel seal 126 is disposed within the bezel seal groove 118 and protrudes from the inner and outer bezel interface 114, 116 such that, when the bezel 100 is coupled to the enclosure housing 128, the bezel seal 126 is squeezed, sealing the interface between the bezel 100 and the enclosure housing 128. In the depicted embodiment, the bezel seal 126 is constructed of silicone. In other alternative embodiments, however, the bezel seal 126 may be constructed of Teflon, fluorosilicone, urethane, HNBR, polyacrylate, neoprene, butyl, hypalon, rubber, or the like.

Front Cover

With reference to FIG. 5, the display opening 105 is covered by the front cover 122 having a front surface 123 and a rear surface 125. The front cover 122 comprises a plate of a substantially transparent material that permits viewing of the display device 124 within the display enclosure 10. Accordingly, the front cover 122 may comprise glass or a substantially transparent plastic. In a particular embodiment, the front cover 122 comprises tempered glass having a thickness of approximately 6 millimeter, though other thicknesses may be used.

As shown in FIGS. 7 and 7A, the bezel front cover ledge 109 may be disposed along the bezel inner edge 108 and be recessed from the bezel interface 113, defining the front cover interface 112, to receive the front cover 122. The bezel front cover ledge 109 may be recessed from the bezel interface 113 about the thickness of the front cover 122 so that the bezel interface 113 and the rear surface 125 of the front cover 122 define a substantially smooth surface. In other words, the rear surface 125 of the front cover 122 is neither perceptibly raised above, nor depressed below the bezel interface 113. Alternatively, the front cover 122 may extend over the front of the bezel front surface 102 to the outer periphery 106 of the bezel 100 or a portion thereof. In yet another embodiment, the front cover 122 may be disposed in front of the bezel front surface 102 and received within the bezel 100.

The front cover 122 is joined to the bezel 100 in a manner that prevents ingress of liquids into the display enclosure 10. For example, the front cover 122 may be bonded to the bezel 100 using an adhesive such as a urethane adhesive. The front cover 122 may further include an anti-reflective coating on the front and/or rear surfaces 123, 125 to reduce photopic reflection. The front cover 122 may also be treated to mitigate ambient ultraviolet (UV) light degradation of the polarizer module of the display device 124. For example, the front cover 122 may include a UV coating configured to shield the polarizer from at least a portion of ambient UV radiation. In various embodiments, the front cover 122 is of sufficient strength to withstand ambient conditions when the display enclosure 10 is located for outdoor viewing.

Mounting Frame

As illustrated in FIG. 5, the display enclosure 10 includes a mounting frame 140 coupled to the enclosure housing 128 and configured to permit cable access to the access opening 132. As depicted in FIGS. 11-15, the mounting frame 140 includes a mounting frame opening portion 146 and a cable entry portion 148. The mounting frame 140 includes an inner surface 142 and an outer surface 144 substantially opposite the inner surface 142. The mounting frame opening portion 146 defines a mounting frame opening 152, which is configured to be disposed about the periphery of the access opening 132. A boss 154 protrudes from the inner surface 142 of the mounting frame opening portion 146 and is configured to be disposed within the access opening 132. The cable entry portion 148 generally protrudes downward from the mounting frame opening portion 146 and defines a plurality of cable channels 149. The embodiment depicted in FIGS. 5 and 11-15 includes three cable channels 149, but other embodiments could include any number of cable channels 149. The outer surface 144 is substantially planar and is configured to couple to the access opening cover 156.

Figure 4:
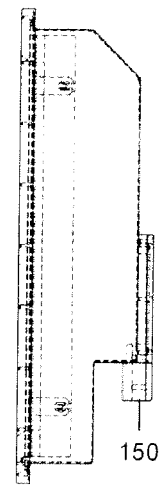
FIG. 4 is a right side elevational view of the enclosed display device of FIG. 1.

As depicted in FIGS. 5 and 14-15, mounting frame 140 is coupled to the enclosure housing 128. The boss 154 is disposed within the access opening 132 and the mounting frame opening portion 146 is disposed about the periphery of the access opening 132. A boss ledge 155 is adjacent to the bottom 137 of the enclosure housing shelf 135, and the inner surface 142 of the mounting frame is coupled to the rear surface 138 of the enclosure housing 128. With reference to FIGS. 4 and 15-16, the cable entry portion 148 protrudes downward from the bottom 137 of the enclosure housing shelf 135.

Access Opening Cover

As illustrated in FIGS. 5 and 17-19, an access opening cover 156 is coupled to the outer surface 144 of mounting frame 140. The access opening cover 156 is substantially planar and includes an outer side 158 and an inner side 160. The access opening cover 156 includes an access opening seal groove 162 configured to house an access opening seal 164. An access opening seal 164 is disposed within the access opening seal groove 162 and protrudes from the inner side 160 of access opening cover 156 such that, when the inner side 160 of access opening cover 156 is coupled to the outer surface 144 of the mounting frame 140, the access opening seal 164 is squeezed, sealing both the access opening seal groove 162 and the interface between the access opening cover 156 and the outer surface 144 of the mounting frame 140. In the depicted embodiment, the access opening seal 164 is constructed of silicone. In other alternative embodiments, however, the access opening seal 164 may be constructed of Teflon, fluorosilicone, urethane, HNBR, polyacrylate, neoprene, butyl, hypalon, rubber, or the like.

As illustrated in FIGS. 5 and 11-15, the access opening cover 156 and the cable entry portion 148 of the mounting frame 140 define a plurality of cable openings 150, which permit cable access to the access opening 132. While the access opening seal 164 seals both the access opening seal groove 162 and the interface between the access opening cover 156 and the outer surface 144 of the mounting frame 140, the cable openings 150 still permit ingress to the enclosure housing 128. To prevent such ingress, the mounting frame 140 may include cable glands to seal the cable openings 150, preventing ingress of liquid into the display enclosure 10 at the cable entry point.

Assembling the Enclosure

In various embodiments, the display enclosure 10 is assembled by covering the display opening 105 of the bezel 100 with the front cover 122. As depicted in FIG. 5, the front cover 122 is disposed within the recess formed by the front cover interface 112. A plurality of deformable or elastomeric spacers 129 are disposed on the rear surface 125 of the front cover 122. The display device 124 is coupled to the bezel 100 via connecting brackets 120, thereby compressing the plurality of deformable or elastomeric spacers 129 between the front cover 122 and the display device 124 and securing the plurality of deformable or elastomeric spacers 129 therein. The bezel seal 126 is disposed within the bezel seal groove 118 and the bezel 100 is coupled to the enclosure housing 128. The mounting frame 140 is coupled to the rear surface 138 of the enclosure housing 128 such that the boss 154 is disposed within the access opening 132 and the boss ledge 155 is adjacent to the bottom of the enclosure shelf 137.

The access opening seal 164 is disposed within the access opening seal groove 162, and the access opening cover 156 is coupled to the outer surface 144 of the mounting frame 140. In a particular embodiment, cable glands are disposed within the cable channels 149 prior to coupling the access opening cover 156 to seal the cable openings 150 formed by the cable channels 149 and the access opening cover 156.

Thermal Modulation and Other Features

Various thermal control devices may be disposed within or at least partially within the display enclosure 10, to assist in maintaining the internal temperature of the display enclosure 10. Thermal control may be accomplished by including devices intended to add and/or remove heat from the display enclosure 10 depending on ambient conditions and/or the operating conduction of the display device 124. The various thermal control devices may work independently or in concert to assist in modulating the temperature inside the display enclosure 10 within the operating temperature range and/or storage temperature range of the display device 124 under various ambient conditions. In a particular embodiment, the display enclosure 10 is capable of maintaining the internal temperature inside the enclosure within the operating range of the display device 124 for an ambient temperature range of between about negative 20 degrees Celsius and about 40 degrees Celsius. The thermal control devices within the display enclosure 10 may comprise passive and/or active devices. In an alternative embodiment, the enclosure housing 128 may include a heat sink portion, dissipating heat generated from within the display enclosure 10 to the environment outside the enclosure. As such, in at least a portion of the enclosure housing 128 may comprise a material having a relatively high thermal conductivity. For example, in an embodiment, the enclosure housing 128 may comprises die cast aluminum.

Various electronics may be mounted within the display enclosure 10, particularly within the space defined by the display device 124 and the enclosure housing 128. For example, a power supply 200 is electrically coupled to a power source, for example, directly or indirectly to a conventional power grid or other source. An EMI filter 202 may be included between the power source and the power supply 200. The power supply 200 may be used to power devices located within the display enclosure 10 such as, for example, the internal fan 212, the heating element 216, and the thermal control unit 214. The power supply 200 may also be configured to supply power to the display device 124. In addition to the display device 124, the power supply 200 may be a significant heat generator that may raise the internal temperature within the display enclosure 10 during operation. Accordingly, the power supply 200 may include one or more heat sinks operatively coupled to the enclosure housing 128 to facilitate dissipation of heat generated within the display enclosure 10.

In addition, an on screen display (OSD) interface 204 may be mounted within the display enclosure 10. The OSD interface 204 may include a number of inputs operable by a user that allow for manual control and/or adjustment of settings of the display device 124. Further, a display controller 206 that controls the display device 124 may be mounted within display enclosure 10. Alternatively, the display controller 206 may be integral with the display device 124. The display controller 206 is electrically coupled to the power supply 200, the display device 124, and the OSD interface 204. The display controller 206 includes inputs for receiving typical audio/visual signals, such as, for example, HDMI, VGA, PC audio input, component video, S-video, composite video, SPDIF, audio inputs, and ATSC/cable tuner. The display controller 206 includes processing components for output of a signal for display by the display device 124. An audio output from the display controller 206 may be directed to the display device 124 or to stand-alone audio equipment that may be situated outside the display enclosure 10. The display controller 206 is also coupled to the OSD 204 accessible from the rear of the display enclosure 10.

The display enclosure 10 may also be provided with an ambient light sensor 208. The ambient light sensor 208 senses the light level outside the display enclosure 10 and may be mounted to the bezel 100 or beneath the front cover 122. The ambient light sensor 208 is electrically coupled to the power supply 200 and the display controller 206. The display controller 206 receives input from the ambient light sensor 208 and, based on the input signal, may be configured to adjust the displayed image, for example, the brightness and/or contrast, generated by the display device 124. For instance, under relatively low ambient light conditions, such as at night when the display enclosure 10 is located outdoors, the display controller 206 may be configured to automatically decrease the brightness of the display device 124 based on the input from the ambient light sensor 208.

The display enclosure 10 may also be provided with features that enable communication between the display device 124 and a remote control device configured to control and the display device 124. The display enclosure 10 may include a remote control input 210. The remote control input 210 comprises an infrared sensor in a particular embodiment. The remote control input 210 is electrically coupled to the display controller 206 and may be mounted to the bezel 100 or located beneath the front cover 122 to receive input from a separate remote control device configured to control the operation of the display device 124.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. An enclosure for enclosing a flat panel display, comprising:
    a bezel having a peripheral surface defining an enclosure area and an inner edge defining a display opening;
    a substantially transparent front cover operatively connected to the bezel and covering the display opening;
    an enclosure housing having a front opening and a rear surface substantially opposite the front opening, the rear surface defining an access opening, the access opening providing entry to an interior portion of the enclosure when the bezel, the front cover, and the enclosure housing are in an assembled state;
    an access opening cover configured to cover the access opening;
    a sealing member receiving region defined by one of the enclosure housing and the access opening cover; and
    a sealing member operatively connected to the sealing member receiving region,
    wherein when the access opening cover is operatively connected to the enclosure housing, an interface between the enclosure housing and the access opening cover is substantially sealed and resistant to liquid ingress.

2. The enclosure of claim 1, wherein the sealing member comprises an access opening seal, and wherein the sealing member receiving region comprises an access opening cover groove disposed on the access opening cover, the access opening cover groove configured to receive at least a portion of the access opening cover seal.

3. The enclosure of claim 2, wherein the access opening cover includes an inner side and an outer side, the access opening cover groove disposed on the inner side.

4. The enclosure of claim 3, wherein when the inner side of the access opening cover is operatively connected to the enclosure housing, the access opening cover seal substantially seals the access opening cover groove and the interface between the access opening cover and the enclosure housing.

5. The enclosure of claim 4, wherein the access opening cover seal comprises an o-ring.

6. The enclosure of claim 5, wherein the o-ring is constructed of silicone.

7. The enclosure of claim 4, further comprising a mounting frame disposed between the enclosure housing and the access opening cover, the mounting frame including:
    a mounting frame opening portion disposed about a periphery of the access opening, and
    a cable access portion configured to permit a plurality of cables to be routed from an outside of the enclosure to the flat panel display.

8. The enclosure of claim 7, wherein the mounting frame includes an outer surface, an inner surface, and a boss disposed on the inner surface, the boss configured to be disposed within the access opening when the mounting frame is coupled to the enclosure housing.

9. The enclosure of claim 8, wherein the cable access portion defines a plurality of cable access channels on the outer surface, the cable access channels configured to permit a plurality of cables to be routed from the outside of the enclosure to the flat panel display.

10. The enclosure of claim 9, wherein when the access opening cover is operatively connected to the outer surface of the mounting frame, the plurality of cable access channels and the cover define a plurality of cable openings.

11. The enclosure of claim 10, wherein at least one cable gland is disposed within each of the plurality of cable openings, the at least one cable gland configured to permit at least one cable to be disposed within each of the plurality of cable openings while substantially sealing each of the plurality of cable openings.

12. An enclosure for enclosing a flat panel display, comprising:
    a bezel having a peripheral surface defining an enclosure area and an inner edge defining a display opening;
    a substantially transparent front cover operatively connected to the bezel and covering the display opening;
    an enclosure housing having a front opening and a rear surface substantially opposite the front opening, the rear surface defining an access opening, the access opening providing entry to an interior portion of the enclosure when the bezel, the front cover, and the enclosure housing are in an assembled state;
    a mounting frame having an inner side and an outer side, the mounting frame having a mounting frame opening portion disposed about a periphery of the access opening and a cable access portion configured to receive a plurality of cables; and
    an access opening cover configured to be operatively connected to the mounting frame,
    wherein the mounting frame and the access opening cover are joined together at a joining region that is substantially sealed and resistant to liquid ingress.

13. The enclosure of claim 12, wherein the joining region further comprises an access opening cover groove disposed on an inner surface of the access opening cover, and wherein an access opening cover seal is disposed at least partially within the access opening cover groove such that, when the access opening cover is operatively connected to the mounting frame, the access opening cover seal is compressed, sealing the access opening cover groove and an interface between the access opening cover and the mounting frame.

14. The enclosure of claim 13, wherein the access opening cover seal comprises an o-ring.

15. The enclosure of claim 14, wherein the o-ring is selected from the group consisting of silicone, Teflon, fluorosilicone, urethane, HNBR, polyacrylate, neoprene, butyl, hypalon, and rubber.

16. The enclosure of claim 12, wherein when the access opening cover is operatively connected to an outer surface of the mounting frame, the cable access portion and the access opening cover define a plurality of cable openings.

17. The enclosure of claim 16, wherein at least one cable gland is disposed within the cable openings, the at least one cable gland configured to permit at least one cable to be disposed within each of the plurality of cable openings while substantially sealing each of the plurality of cable openings.

18. A method of preparing a substantially sealed enclosure for enclosing a flat panel display device, comprising:
   providing a bezel defining an outer peripheral surface and a display opening;
   providing a front cover to the bezel, the front cover covering the display opening;
   attaching an enclosure housing to the bezel, the enclosure housing having a front opening and a rear surface substantially opposite the front opening, the rear surface defining an access opening, the access opening providing entry to an interior portion of the enclosure when the bezel, the front cover, and the enclosure housing are in an assembled state; and
   covering the access opening with an access opening cover having an access cover seal groove and a seal disposed within the groove;
   wherein the access opening cover is configured to permit access to the enclosure, and wherein the enclosure is substantially sealed and resistant to liquid ingress.

19. The method of claim 18 further comprising providing a mounting frame about a periphery of the access opening and attaching the access opening cover to the mounting frame,
   wherein the mounting frame includes a mounting frame opening portion and a cable access portion, the cable access portion defining a plurality of cable channels,
   wherein when the access opening cover is coupled to the mounting frame a plurality of cable openings are formed.

20. The method of claim 19 further comprising providing one or more cable glands within the plurality of cable channels.

* * * * *